(12) United States Patent
Bowers et al.

(10) Patent No.: US 8,801,504 B2
(45) Date of Patent: *Aug. 12, 2014

(54) $CO_2$ NOZZLES (71) Applicant: Rave N.P., Inc., Delray Beach, FL (US)

(72) Inventors: Charles W. Bowers, Livermore, CA (US); Ivin Varghese, Livermore, CA (US); Mehdi Balooch, Berkeley, CA (US)

(73) Assignee: Rave N.P., Inc., Delray Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/886,594

(22) Filed: May 3, 2013

(65) Prior Publication Data

US 2013/0244550 A1  Sep. 19, 2013

Related U.S. Application Data

(63) Continuation of application No. 12/556,643, filed on Sep. 10, 2009, now Pat. No. 8,454,409.

(51) Int. Cl.
*B24C 5/04* (2006.01)

(52) U.S. Cl.
USPC .......................................................... 451/102

(58) Field of Classification Search
USPC ................................................... 451/102, 40
See application file for complete search history.

(56) References Cited

U.S. PATENT DOCUMENTS

| | | | |
|---|---|---|---|
| 2,351,430 A * | 6/1944 | Huthsing | 169/11 |
| 2,645,292 A * | 7/1953 | Clifford | 169/15 |
| 4,774,416 A | 9/1988 | Askary et al. | |
| 4,806,171 A | 2/1989 | Whitlock et al. | |
| 4,962,891 A | 10/1990 | Layden | |
| 5,315,793 A | 5/1994 | Peterson et al. | |
| 5,390,450 A * | 2/1995 | Goenka | 451/75 |
| 5,409,418 A * | 4/1995 | Krone-Schmidt et al. | 451/75 |
| 5,549,246 A | 8/1996 | Kukesh | |
| 5,611,491 A | 3/1997 | Bowers | |
| 5,616,067 A | 4/1997 | Goenka | |
| 5,775,127 A | 7/1998 | Zito | |
| 5,837,064 A | 11/1998 | Bowers | |
| 5,853,128 A * | 12/1998 | Bowen et al. | 451/39 |
| 6,146,466 A | 11/2000 | Bowers | |
| 6,173,916 B1 * | 1/2001 | Krone-Schmidt | 239/590.3 |
| 6,543,251 B1 * | 4/2003 | Gasteyer et al. | 62/603 |
| 7,293,570 B2 | 11/2007 | Jackson | |
| 7,389,941 B2 * | 6/2008 | Jackson | 239/3 |
| 8,454,409 B2 * | 6/2013 | Bowers et al. | 451/40 |
| 2003/0104764 A1 * | 6/2003 | Preising | 451/39 |
| 2005/0272347 A1 * | 12/2005 | Spalteholz et al. | 451/7 |
| 2007/0125881 A1 * | 6/2007 | Gansebom | 239/428.5 |
| 2007/0164130 A1 | 7/2007 | Jackson | |

* cited by examiner

*Primary Examiner* — Maurina Rachuba
(74) *Attorney, Agent, or Firm* — Baker & Hostetler LLP

(57) ABSTRACT

A nozzle for providing carbon dioxide for cleaning is disclosed. The nozzle includes a reservoir for receiving liquid carbon dioxide, a barrel defining a passageway therethrough, the passageway extending to an outlet of the barrel, an orifice effecting fluid communication between the reservoir and the passageway, and a screen member constructed and arranged for interrupting flow of the carbon dioxide pellets greater than a select size from being emitted from the passageway of the barrel. Liquid carbon dioxide flows through the orifice to phase transfer into gaseous carbon dioxide and carbon dioxide pellets in the passageway. An internal diameter of the passageway is smaller than an internal diameter of the reservoir.

24 Claims, 5 Drawing Sheets

$CO_2$ NOZZLES

CROSS-REFERENCE TO RELATED APPLICATIONS

This application is a Continuation of U.S. patent application Ser. No. 12/556,643, filed on Sep. 10, 2009, the disclosure of which is incorporated herein by reference in its entirety.

TECHNICAL FIELD

The present disclosure relates to nozzles for removing particle impurities from surfaces and structures during for example wafer processing without damaging the structures themselves.

BACKGROUND

The use of carbon dioxide ($CO_2$) spray to remove particles sized from micrometers to as small as nanometers from surfaces has emerged in cleaning technology as an acceptable replacement for Freon cleaning. Effective delivery of $CO_2$ will remove the particulate contamination and organic films (light oils, silicone lubricants, etc.) by momentum transfer between the $CO_2$ snow and contaminant.

$CO_2$ snow is used to clean for example optical components. In general, the $CO_2$ jet needs to be controlled in its combination of solid snow called "pellets" of $CO_2$ (i.e. dry ice) and gaseous $CO_2$. The $CO_2$ snow properties such as size, velocity, density and flux can be controlled by the design of the nozzle employed, as well as by other characteristics of the $CO_2$ at the $CO_2$ source such as pressure and temperature. Carbon dioxide snow cleaning is dry, nonabrasive, chemical-free and residue-free, thus making this cleaning procedure attractive for many critical cleaning applications.

in a conventional nozzle, the nucleation, growth and compacting of $CO_2$ snow takes place after expansion through an orifice separating inlet liquid $CO_2$ (at approximately 800 psi) from the expanding gas phase in the downstream cavity of the nozzle (so called barrel). The $CO_2$ plume contains snow pellets with sizes that can exceed 50 micrometers (µm) in diameter, and yet still have velocities comparable to smaller size snow pellets. These larger pellets (whether they are $CO_2$ or a contaminant initiating from the $CO_2$ source tank) travel with a momentum sufficiently large to damage tine structures of the workpiece being cleaned or processed, if the number and momentum of the particles additively exceeds the device damage threshold value.

$CO_2$ molecules can coalesce or agglomerate onto a $CO_2$ assembly. This agglomeration of the $CO_2$ molecules occurs during passage through the orifice or directly after, where the liquid $CO_2$ converts to the $CO_2$ gas phase in the downstream barrel-like tube. Additionally, contaminants may build up or accumulate on the wall of the barrel along with the $CO_2$ agglomerates, "Adders" result from contaminants on the $CO_2$ source which accumulate from agglomeration in the nozzle and then are deposited on a surface of the workpiece or wafer being cleaned. The adders are thus transported in the $CO_2$ stream from the nozzle onto the object or surface to be cleaned. Such adders when discharged from known nozzles can cause contamination by adhering to the very surface that the nozzle is being employed to clean and can possibly damage the surface as well. Mitigating the agglomeration at the barrel interior surface would correspondingly reduce if not eliminate the adders and problems associated therewith.

To overcome this deficiency, it is known to purify a $CO_2$ reservoir to less than parts per billion ("ppb") if at all possible, and to clean and degrease an interior surface of the nozzle of lubricants which were used during machining and drilling by electropolishing, extrusion techniques, etc., to construct the nozzle. Of course, some residue, such as a film layer, may remain from nozzle fabrication disposed at an inner surface of the nozzle, which residue is reduced to an extent by baking-out the nozzle.

SUMMARY

In one aspect, the disclosure describes a nozzle for providing carbon dioxide for cleaning including a reservoir for receiving liquid carbon dioxide, a barrel defining a passageway therethrough, the passageway extending to an outlet of the barrel, an orifice effecting fluid communication between the reservoir and the passageway, and a screen member constructed and arranged for interrupting flow of the carbon dioxide pellets greater than a select size from being emitted from the passageway of the barrel. Liquid carbon dioxide flows through the orifice to phase transfer into gaseous carbon dioxide and carbon dioxide pellets in the passageway. An internal diameter of the passageway is smaller than an internal diameter of the reservoir.

In another aspect, the disclosure describes a nozzle for providing carbon dioxide for cleaning including a housing having an outlet, and a reservoir for liquid carbon dioxide within the housing. An internal diameter of the outlet is smaller than an internal diameter of the reservoir. The reservoir is in communication with the outlet and has a reduced diameter approaching the outlet for facilitating a phase transfer of the liquid carbon dioxide into gaseous carbon dioxide and carbon dioxide pellets.

In yet another aspect, the disclosure describes a nozzle for providing carbon dioxide for cleaning including a reservoir for receiving liquid carbon dioxide, a barrel defining a passageway therethrough, the passageway extending to an outlet of the barrel, an orifice effecting fluid communication between the reservoir and the passageway, and a screen member constructed and arranged for interrupting flow of the carbon dioxide pellets greater than a select size from being emitted from the passageway of the barrel. Liquid carbon dioxide flows through the orifice to phase transfer into gaseous carbon dioxide and carbon dioxide pellets in the passageway. The barrel is free from overlap with the reservoir along a longitudinal axis of the barrel.

BRIEF DESCRIPTION OF THE DRAWINGS

For a more complete understanding of the present embodiments, reference may be had to the description of the embodiments which follow taken in connection with the accompanying drawings, of which.

DETAILED DESCRIPTION

The present nozzle embodiments of the FIGS. 1-6 reduce the amount of contaminants in the $CO_2$ plume or stream used for cleaning, by trapping the contaminants and/or reducing the size of the contaminants, and also controlling the size, velocity and flux of the $CO_2$ pellets in the plume or stream.

For this purpose, the $CO_2$ reservoir is purified to less than ppb and the connecting tube to the nozzle is cleaned by Acetone rinse, Isopropyl Alcohol (IPA) rinse, followed by a 24 hour bake-out at nearly 300° C. in a nitrogen ($N_2$) purged environment. The nozzle is initially degreased from lubricants used in machining and drilling by electropolishing, and extrusion techniques. The subsequent precision cleaning procedure includes hot ultra pure de-Ionized (DI) water rinse, acetone bath with ultrasonic, IPA bath with ultrasonic, followed by hot DI water ultrasonic bath. Even with such elaborate and careful cleaning methods some residue will remain as thin film layers disposed on an inner wall of the nozzle. Additional and final cleaning steps are required to mitigate these residues, a twenty-four hour bake-out of the nozzle at nearly 300° C. in a $N_2$ purge environment is carried out first, and subsequently ultra-high purity $CO_2$ is run through the nozzle (purged) for a sufficient period of time, after which the plume or exhaust of $CO_2$ from the nozzle evaluated by counting the "adders" on a clean silicon wafer before and after exposure to the $CO_2$. The total adders from the nozzle will approach zero as the remaining residual contamination is reduced. The nozzle is determined to be qualified for a cleaning application when the total adders present is zero for a predetermined size of adders.

The present nozzle embodiments control the $CO_2$ particle size and velocity distribution as well as the flux of $CO_2$ (molecules or agglomerated particles) emitted from the nozzle to allow the $CO_2$ plume or $CO_2$ molecular beam to clean the contaminated workpiece without damaging the structures on the workpiece. The nozzle traps contaminates existing along a pathway of the $CO_2$ stream from being carried by the $CO_2$ plume to the workpiece.

The present embodiments prevent the nucleated $CO_2$ snow particles and contaminants, having larger than a specific diameter, from reaching the workpiece. This is accomplished by disposing a screen or sieve for preventing the large $CO_2$ particles from being emitted from the nozzle to the workpiece. The screen can be of different constructions as discussed below and disposed downstream of a nozzle orifice at select locations in a barrel of the nozzle. The size of the openings in the screen determines the maximum size of snow particles (and contaminants) that can escape through the screen. All dimensions recited below are by way of example only.

Figure 1A:
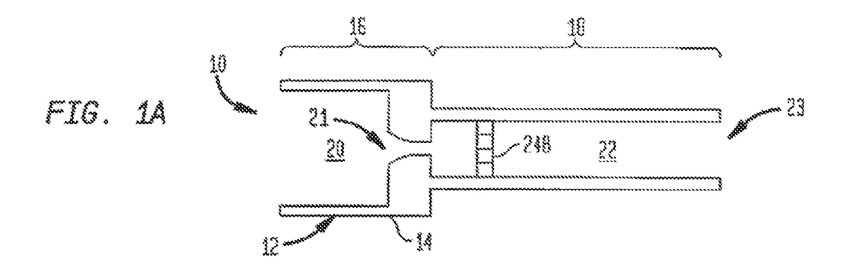
FIG. 1A shows a cross-sectional plan view of a nozzle embodiment.
Figure 1B:
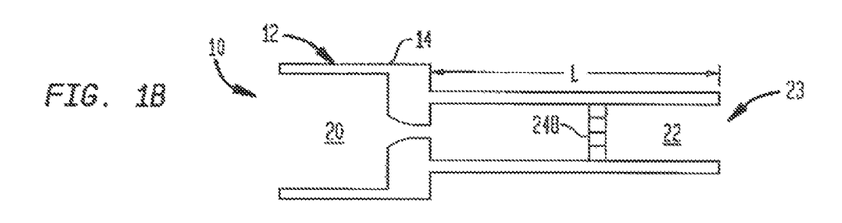
FIG. 1B shows another cross-sectional plan view of another nozzle embodiment.
Figure 1C:
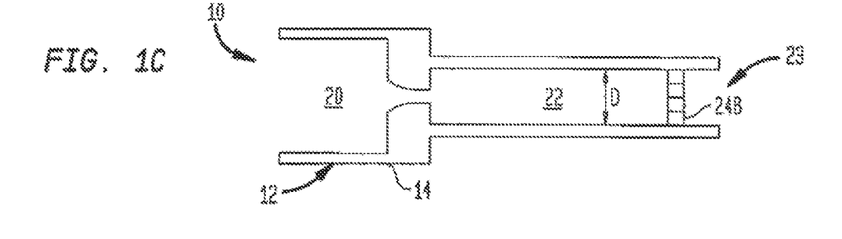
FIG. 1C shows still another cross-sectional plan view of a nozzle embodiment.

Referring to FIGS. 1A-1C, there is shown a nozzle 10 which includes a housing 12 formed by a sidewall 14. The sidewall 14 is of metallic construction. The housing 12 includes a reservoir portion 16 and a barrel portion 18. The reservoir and barrel portions 16, 18, respectively, may be formed as an integral unit or alternatively the barrel portion 18 may be press fit, soldered or welded to the reservoir portion 16.

The reservoir portion 16 of the housing 12 includes a chamber or reservoir 20 in which liquid $CO_2$ is provided. The barrel portion 18 includes a passageway 22, which extends to an outlet 23 of the barrel 18. An orifice or port 21 of the reservoir portion 16 interconnects the reservoir 20 with the passageway 22. The reservoir 20 is connected to a source (not shown) of liquid $CO_2$.

The barrel portion may have a length "L" of up to as much as 1-1.5" (2.54-4.0 cm). An internal diameter "D" of the passageway 22 may range from 0.05-0.5 inches (1 mm-13 mm).

Figure 2A:
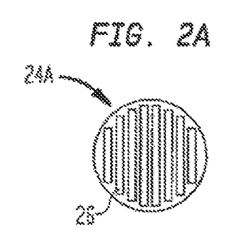
FIGS. 2A-2C show screen or sieve elements which can be used with the nozzle embodiments of FIGS. 1A-1C.
Figure 2B:
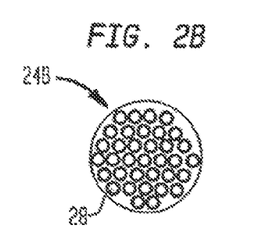
Figure 2C:
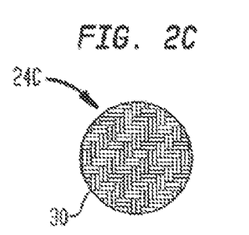

Referring to FIGS. 2A-2C, there is shown a plurality of screens or sieves 24A, 24B, 24C (collectively "24A-24C"), each of which is constructed for being disposed in the passageway 22 of the barrel portion 18 of the nozzle 10, as shown in FIGS. 1A-1C for example. The screens 24A-24C have a diameter sufficient to permit them to be disposed to extend across or span the passageway 22 and impede the flow of $CO_2$ through the passageway 22.

The screens 24A-24C are constructed with different perforations. For example, the screen 24A includes elongated perforations 26 arranged as slots also called multi-slots). The screen 24A can be disposed in the passageway 22 such that the perforations 26 extend vertically or perhaps horizontally, or in any angle therebetween, needed. The screen 24A is usually used when the flux of the $CO_2$ particles from a particular nozzle is required to be of a given size range with no larger particles. Thus, the screen is equivalent to a cutoff filter for the larger particles that would damage a delicate device, while permitting the particles capable of efficient, non-cleaning to pass through the screen. The dimensions of the elongated slots or perforations 26 can be uniform or can vary as shown in FIG. 2A. The dimensions of the slots 26 can range from a width of 1.0-10 µm, and the length can be from 1-5 mm. The screens 24A-24C permit $CO_2$ pellets of a select or pre-determined size only to be able to pass through the particular screen.

The screen 24B includes a plurality of circular perforations or holes 28 extending therethrough (called a multi-channel plate). Any number of perforations 28 can be formed in the screen 24B. Each one of the perforations 28 can have the same diameter, which can range from 0.5-10 µm, or the perforations 28 can have different diameters. The arrangement of the perforations 28 resemble a multi-channel plate. The length of each perforation 28, which resembles a tube extending through the screen 24B, may be from 0.5 mm to 3 mm. The perforations 28 or tubes act as a collimator for the $CO_2$ stream (or molecular beam), and in effect replaces or obviates the need for the barrel portion 18. See also FIG. 38 discussed further below.

The screen 24C is manufactured of a plurality of crossed-hatched metallic wires to provide a wire mesh having a multiplicity of apertures 30 therein. The wire mesh can be arranged in any manner of crosshatching in order to provide perforations 30 of common or varying sizes to ensnare $CO_2$ particles of certain sizes from passing through the passageway 22 of the barrel portion 18.

Referring still to FIGS. 1A-1C and 2A-2C, it can be seen that at least one of the screens 24A-24C is selected to be disposed in the passageway 22 of the nozzle 10. Depending upon the type of cleaning application and the component to be cleaned, the screen 24A-24C is selected based upon the position in which the screen will be disposed in the passageway 22. For example, different screens provide different size and velocity distribution of the $CO_2$ snow. The position of the screen in the barrel affects the size and velocity distribution, as well as the degree of collimation of the beam leaving the barrel for the workpiece.

The orifice 21 has an inlet at the reservoir portion 16 with a diameter of as much as 3-5 mm, transitioning to an outlet at the barrel portion 18 where it enters the passageway 22 having a diameter of 1.0 ram to 10 mm for interconnecting the reservoir 20 with the passageway 22. The liquid $CO_2$ in the reservoir 20 passing through the orifice 21 diffuses to create combined $CO_2$ gaseous and solid phase $CO_2$ at the passageway 22 of the barrel portion 18. The size distribution of the solid $CO_2$, however, is broad. The screens 24A-24C will catch or ensnare the large $CO_2$ particles and large contaminants that may cause damage to the substrate to be cleaned.

As shown in FIGS. 1A-1C, the screen can be disposed at different locations along the interior of passageway 22 of the barrel 18. The position of the screen in the passageway 22 affects particle size emitted from the outlet 23, i.e. the screen inserted closer to the outlet 23 allows less agglomeration downstream of the screen and therefore tighter (narrower) size distribution. However, the $CO_2$ stream will become less parallel (collimated or straight) if the screen is closer to the outlet 23. As a result, the $CO_2$ beam spreads out or expands after leaving the barrel 18 and therefore covers a larger area on the workpiece, although with less intensity. This arrangement is suitable for cleaning finer structures on the workpiece. On the other hand, positioning the screen closer to the orifice 21 allows more collimation of the beam, but with larger agglomeration of $CO_2$, an arrangement more suitable for removal of larger contaminates on the workpiece.

Figure 3A:
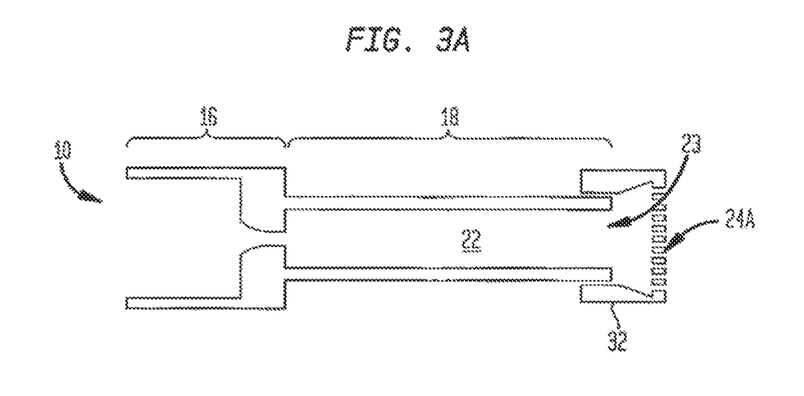
FIG. 3A shows a cross-sectional plan view of another nozzle embodiment.
Figure 3B:
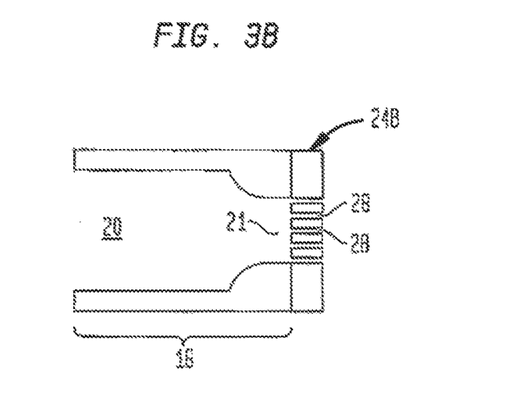
FIG. 3B shows a cross-sectional plan view of another nozzle embodiment.

For gentler cleaning with the $CO_2$, the screen, for example screen 24A, can be disposed proximate the outlet 23 at an end of the barrel 18 of the nozzle 10 as shown in FIG. 3A. A collar 32 is mounted at the outlet 23 of the nozzle 10 for supporting the screen 24A proximate the outlet. The collar 32 can be permanently affixed to the outlet 23 of the barrel portion 18 or alternatively, releaseably engagable to the outlet of the barrel portion 18. The arrangement of the collar 32 with respect to the outlet 23 and in order to accommodate the screen 24A at the outlet, provides for an increased cross-sectional area at the outlet resulting in the $CO_2$ plume no longer being collimated (parallel or straight). As a result, the force per unit area of the $CO_2$ stream upon the structures at the workpiece is substantially reduced. This type of nozzle arrangement is useful for cleaning workpieces with fine and high aspect ratio structures thereon. Each one of the screens 24A, 24B, 24C may include the collar 32, so that the screens can be selected and changed out by manipulating the collar 32 with respect to the barrel 18 so as not to compromise the cleanliness of the passageway 22.

The screens 24A-24C of the embodiments trap the large $CO_2$ particles so that same sublime at an upstream side of the screen. Eventually, the $CO_2$ particles become small enough to pass through the screen with acceptably-sized $CO_2$ particles and also with a reduced flux, for effective non-damaging cleaning of the workpiece.

Referring to FIG. 3B, one of the screens 24A-24C is selected, by way of example only, to be mounted at the outlet of the orifice 21, thereby obviating the need for the barrel portion 18 and the passageway 22. The screen 249 can be permanently mounted to the reservoir portion 16 or removably mountable to the portion 16. Use of the screen 24B for example mounted to the reservoir portion 16 brings the perforations 28 of the screen into registration with the orifice 21 outlet, wherein the $CO_2$ stream emerging downstream from the screen 249 remains collimated with $CO_2$ particles not exceeding a particular size.

Figure 4:
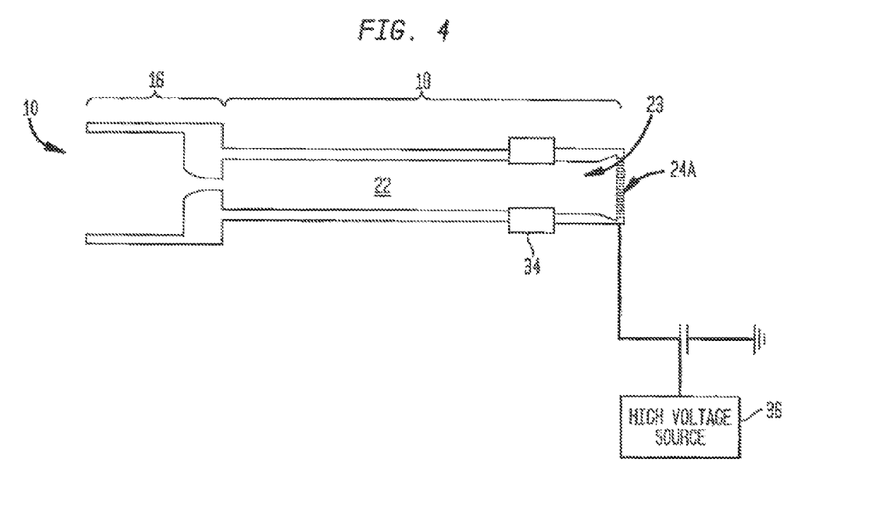
FIG. 4 shows a cross-sectional plan view of another nozzle embodiment for reducing electrical charge of the $CO_2$.

The $CO_2$ snow particles may also carry electrostatic charges that could adversely affect the cleaning ability of the nozzle 10. The charges are created by tribo-action, i.e. friction between two species (also called tribo-charging) such as between the $CO_2$ particles and a wall of the passageway 22. FIG. 4 shows a nozzle assembly that will mitigate any charges present. The screen 24A-24C and downstream thereof are electrically isolated from the rest of the assembly and can be grounded or elevated to different potentials for charge transfer purposes to or from the $CO_2$ snow. As shown in FIG. 4, an electrical insulator ring 34 is mounted to the barrel portion 18 of the nozzle 10. The ring 34 is mounted proximate the outlet 23 of the barrel portion 18. A voltage source 36 is connected or wired to the screen 24A or the collar 32 for the screen. The mitigation occurs when a $CO_2$ particle passes through for example the screen 24A. A negatively charged $CO_2$ particle passing through the screen 24A will be stripped of electric charge creating a neutral $CO_2$ particle downstream of the screen 24A. The ring 34 and the voltage source 36 can be used as well with the other embodiments herein described to mitigate electrostatic charges. If the embodiment does not call for using one of the screens 24A-24C, then the voltage source 36 can be connected to the nozzle or barrel itself.

Figure 5:
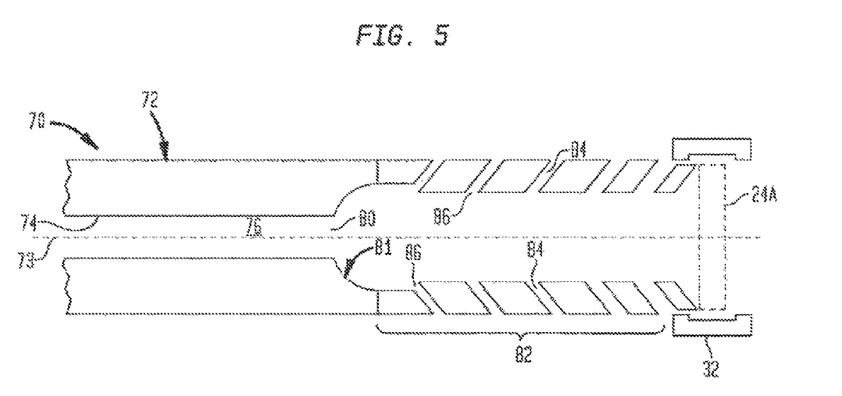
FIG. 5 shows a cross-section view of another nozzle embodiment.

In FIG. 5, a nozzle 70 is shown having a sidewall 72 with an inner surface 74 defining a chamber or passageway 76 extending through the nozzle. The inner surface 74 of the nozzle 70 extends to an outlet 80 of the nozzle 70, wherein the inner surface 74 provides an outwardly extending concave shape shown generally at 81 of the outlet 80. The sidewall 72 extends from the outlet 80 as a perforated portion 82 having at least one or alternatively a plurality of holes 84 or apertures formed therein. The holes 84 may be angled with respect to a longitudinal axis 73 of the nozzle 70 as shown in FIG. 5. Openings 86 of the holes 84 face or open toward the $CO_2$ being emitted from the outlet 80. The holes 84 trap contaminants and agglomerates that are exhausted from the outlet 80 of the nozzle. The shape 81 causes the $CO_2$ to expand, thereby transitioning to the gas and solid phase such that the larger $CO_2$ pellets are directed to the openings 86 where they become trapped in the holes 84.

Selecting in combination, as necessary, screens and electric potential to be a to the $CO_2$ nozzles 10, 70 provides for being able to control the flux, size and velocity distributions of $CO_2$ snow particles in the $CO_2$ plume, and also assists in mitigating impurities ejected from the nozzle.

Alternatively, none, any number of or all of the holes 84 may be open to the atmosphere to permit the exhaust of any bubbles or contaminates in the $CO_2$ beam as it travels from the passageway 76. This provides for better stability of the $CO_2$ plume or beam. The holes 84 or slits provide a phase separator, i.e. the slits 84 permit the gas phase to escape the passageway 76 so that solid $CO_2$ particles for the most part continue down the perforated portion 82. A screen 24A for example can also be disposed at the end of the portion 82 using a collar 32 similar to that shown in FIG. 3A.

FIGS. 6A-6D disclose a plurality of barrel-less nozzle embodiments.

In particular, the nozzle embodiments at FIGS. 6A-6D include nozzles 50, 52, 54, 56 (collectively "50-56"). The nozzles 50-56 each include a sidewall 58 and an orifice 60 through which liquid $CO_2$ passes to phase into solid and gaseous $CO_2$. The size D of the orifice 60 controls the size and flux or amount of $CO_2$ molecules and pellets that are discharged from the nozzles. The shape of the orifice 60 substantially controls the velocity of the solid $CO_2$ particles produced and the degree of collimation of the $CO_2$ particle beam, and also the size and the flux of the $CO_2$ particles in the beam.

The sidewall 58 of each of the nozzles 50-56 includes an inner surface 62 defining an interior chamber or passageway 64 for each of the nozzles 50-56. The nozzles 50-56 use the structure of the orifice 601 order to control the $CO_2$ plume or stream, and the size of the $CO_2$ particles therein. A thickness of the sidewall 58 for each of the nozzles is represented by "X", while a diameter of the orifice 60 is represented by "D". The thickness X can range from 0.5 to 5 mm; while the diameter D can range from 50-500 μm. The orifice 60 can have different shapes for both at inlet of the orifice 65 at the passageway 64, and an outlet of the orifice 60 at for example surface 65.

Figure 6A:
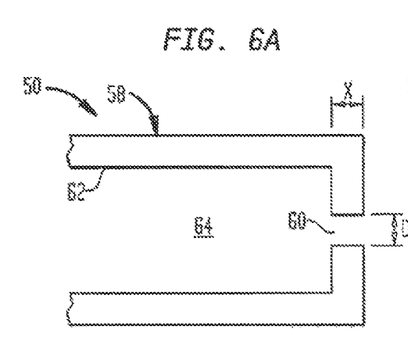
FIGS. 6A-6D show cross-sectional plan views of other nozzle embodiments.
Figure 6B:
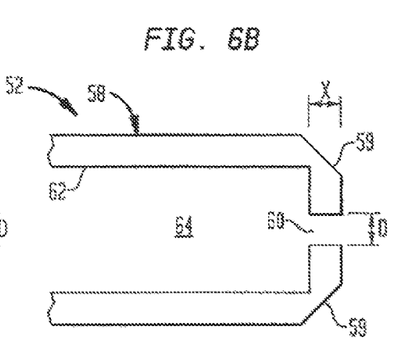

Referring to the nozzles 50, 52 of FIGS. 6A and 6B, the nozzles 50, 52 function similarly, except that the sidewall 58 of the nozzle 52 permits the nozzle 52 to be positioned closer to the workpiece due to a reduced exterior angle surface 59, such as being truncated, whet a non-vertical nozzle angle is required during cleaning. Both the inlet and outlet, respectively, of the orifice 60 are flat-ended.

Figure 6C:
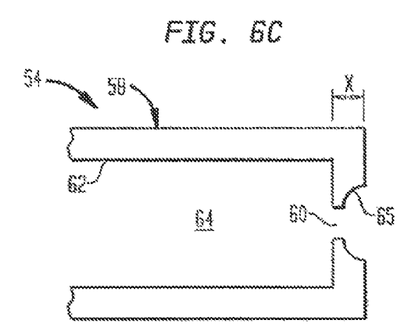

The nozzle 54 of FIG. 6C has an orifice 60 with a concave exhaust surface 65. As the $CO_2$ beam exits the orifice 60, the beam is expanded, collimation is controlled and velocity is increased.

Figure 6D:
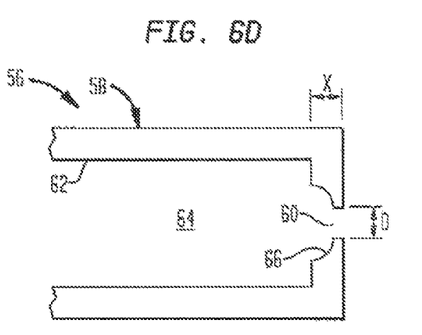

The nozzle 56 of FIG. 60 has an orifice 60 with a straight cylindrical outlet, but a concave surface inlet 66. There is some expansion of the $CO_2$ beam, although it does remain narrower, and velocity of the beam is increased. Generally the velocity of $CO_2$ from the nozzle 54 is greater than the velocity of $CO_2$ from the nozzle 56 having the identical diameter D.

The embodiments of FIGS. 6A-6D mitigate the level of contaminants and agglomerates due to the absence of the barrel for these nozzles. The barrel is considered the bulk area for $CO_2$ nucleation and growth.

It will be understood that the embodiments described herein are merely exemplary and that a person skilled in the art may mike many variations and modifications without departing from the spirit and scope of the invention. All such variations and modifications are intended to be included within the scope of the invention as described and claimed herein. It should be understood that the embodiments described herein are not only in the alternative, but may be combined.

What is claimed is:

1. A nozzle for providing carbon dioxide for cleaning, comprising:
    a reservoir for receiving liquid carbon dioxide;
    a barrel defining a passageway therethrough, the passageway extending to an outlet of the barrel, an internal diameter of the passageway being smaller than an internal diameter of the reservoir;
    an orifice effecting fluid communication between the reservoir and the passageway, and through which the liquid carbon dioxide flows to phase transfer into gaseous carbon dioxide and carbon dioxide pellets in the passageway;
    a screen member constructed and arranged for interrupting flow of the carbon dioxide pellets greater than a select size from being emitted from the passageway of the barrel; and
    the barrel further comprises a plurality of apertures extending therethrough a wall of the barrel.

2. The nozzle of claim 1, wherein the screen member is disposed in the passageway.

3. The nozzle of claim 1, wherein the screen member is disposed at the outlet of the barrel.

4. The nozzle of claim 1, wherein the screen member comprises a plurality of elongated slots extending therethrough.

5. The nozzle of claim 4, wherein the plurality of elongated slots are of different lengths.

6. The nozzle of claim 1, wherein the screen member comprises a plurality of channels extending therethrough.

7. The nozzle of claim 6, wherein at least one of the plurality of channels has a size different than others of the plurality of channels.

8. The nozzle of claim 1, wherein the screen member comprises a collar portion mountable to the barrel at the outlet.

9. The nozzle of claim 8, wherein the collar portion is removably mountable to the barrel at the outlet.

10. The nozzle of claim 1, further comprising: an electrical insulator mounted to the barrel; and
    a voltage source connected to the screen member for actuation to mitigate electro-static charges of the carbon dioxide pellets.

11. The nozzle of claim 1, wherein each one of the plurality of apertures having a first end open at the passageway and angled toward the orifice, and a second end opposite the first end and open to an exterior of the barrel, the plurality of apertures venting at least a portion of the gaseous carbon dioxide from the passageway.

12. The nozzle of claim 11, wherein the screen member is mounted to the outlet of the barrel downstream from the plurality of apertures.

13. The nozzle of claim 11, wherein the orifice comprises an outwardly concave surface proximate the passageway.

14. The nozzle of claim 11, further comprising an electrical insulator mounted to the barrel and a voltage source connected to the screen member for actuation to mitigate electrostatic charges of the carbon dioxide pellets.

15. The nozzle of claim 1, wherein the reservoir comprises a diameter which is reduced in size closer to the orifice.

16. A nozzle for providing carbon dioxide for cleaning, comprising:
    a housing having an outlet;
    a reservoir for liquid carbon dioxide within the housing, an internal diameter of the outlet being smaller than an internal diameter of the reservoir, the reservoir being in communication with the outlet and having a reduced diameter approaching the outlet for facilitating the phase transfer of the liquid carbon dioxide into gaseous carbon dioxide and carbon dioxide pellets; and
    a screen member disposed downstream in a direction of carbon dioxide flow from the outlet for interrupting flow of carbon dioxide pellets greater than a select size from being emitted from the screen member.

17. The nozzle of claim 16, wherein the screen member is removably mountable to the housing at the outlet.

18. The nozzle of claim 16, wherein the screen member comprises a plurality of holes selected from slots and channels.

19. The nozzle of claim 16, wherein an exterior of the housing proximate the outlet comprises a truncated surface area.

20. The nozzle of claim 16, wherein the outlet comprises a concave surface facing the reservoir.

21. The nozzle of claim 16, wherein the outlet comprises a concave surface area facing an exterior of the housing.

22. The nozzle of claim 21, further comprising:
    a barrel extending from the housing and having a passageway therethrough extending to a barrel outlet, the passageway in communication with the housing outlet and through which the liquid carbon dioxide passes to phase transfer into gaseous carbon dioxide and carbon dioxide pellets in the passageway;

a plurality of apertures extending through the barrel, each one of the plurality of apertures having a first end open at the passageway and angled toward the reservoir, and a second end opposite the first end and open to an exterior of the barrel, the plurality of apertures venting at least a portion of the gaseous carbon dioxide from the passageway.

23. The nozzle of claim 22, further comprising an electrical insulator mounted to the barrel, and a voltage source connected to the barrel for actuation to mitigate electro-static charges of the carbon dioxide pellets.

24. A nozzle for providing carbon dioxide for cleaning, comprising:

a reservoir for receiving liquid carbon dioxide;

a barrel defining a passageway therethrough, the passageway extending to an outlet of the barrel, the barrel being free from overlap with the reservoir along a longitudinal axis of the barrel;

an orifice effecting fluid communication between the reservoir and the passageway, and through which the liquid carbon dioxide flows to phase transfer into gaseous carbon dioxide and carbon dioxide pellets in the passageway; and a screen member constructed and arranged for interrupting flow of the carbon dioxide pellets greater than a select size from being emitted from the passageway of the barrel; and the barrel further comprises a plurality of apertures extending therethrough a wall of the barrel.

* * * * *